(12) United States Patent  
Ebigase (10) Patent No.: US 8,575,822 B2  
(45) Date of Patent: Nov. 5, 2013

(54) PIEZOELECTRIC/ELECTROSTRICTIVE ACTUATOR

(75) Inventor: Takashi Ebigase, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 117 days.

(21) Appl. No.: 13/206,837

(22) Filed: Aug. 10, 2011

(65) Prior Publication Data

US 2012/0062071 A1    Mar. 15, 2012

(30) Foreign Application Priority Data

Aug. 13, 2010   (JP) ................... 2010-181220

(51) Int. Cl.
*H01L 41/08* (2006.01)

(52) U.S. Cl.
USPC .......................................... 310/324; 310/332

(58) Field of Classification Search
USPC .......................................... 310/324, 328, 340
See application file for complete search history.

(56) References Cited

U.S. PATENT DOCUMENTS

| | | | |
|---|---|---|---|
| 7,342,351 B2 * | 3/2008 | Kubo et al. | 310/344 |
| 7,948,155 B2 * | 5/2011 | Hishinuma et al. | 310/363 |
| 2003/0141783 A1 * | 7/2003 | Klee et al. | 310/324 |
| 2004/0021529 A1 * | 2/2004 | Bradley et al. | 333/187 |
| 2009/0267446 A1 | 10/2009 | Kashiwaya et al. | |
| 2010/0097431 A1 | 4/2010 | Takakuwa | |

FOREIGN PATENT DOCUMENTS

| | | |
|---|---|---|
| EP | 2 091 091 A2 | 8/2009 |
| JP | 2000-270568 | 9/2000 |
| JP | 2003-062999 | 3/2003 |
| JP | 2003-347621 | 12/2003 |
| JP | 2009-081347 | 4/2009 |
| JP | 2010-188639 A1 | 9/2010 |

* cited by examiner

*Primary Examiner* — Mark Budd  
(74) *Attorney, Agent, or Firm* — Burr & Brown (57) ABSTRACT

A piezoelectric/electrostrictive actuator, including a piezoelectric/electrostrictive element that includes at least one laminate including one piezoelectric/electrostrictive layer and one pair of electrodes disposed respectively on both sides of said piezoelectric/electrostrictive layer and has a moving part corresponding to a portion where said piezoelectric/electrostrictive layer is sandwiched by one pair of said electrodes and a non-moving part corresponding to a portion where said piezoelectric/electrostrictive layer is not sandwiched by one pair of said electrodes, and a moisture proof membrane disposed to cover at least the proximity of the boundary between said moving part and said non-moving part and consisting of silicone-based organic insulation material with storage elastic modulus of 100 kPa or less obtained by dynamic viscoelastic measurement using a parallel cone with diameter of 25 mm under a condition with strain of 0.1%, frequency of 1 Hz, gap of 0.5 mm and temperature of 22° C.

17 Claims, 1 Drawing Sheet

PIEZOELECTRIC/ELECTROSTRICTIVE ACTUATOR

BACKGROUND OF THE INVENTION

1. Field of the Invention

The present invention relates to a piezoelectric/electrostrictive actuator. More particularly, the present invention relates to a piezoelectric/electrostrictive actuator with suppressed inhibition of piezoelectric displacement and improved insulation durability under high humidity atmosphere.

2. Description of Related Art

A piezoelectric/electrostrictive actuator has an advantage that it can precisely control its displacement in submicron order. Especially, a piezoelectric/electrostrictive actuator with a sintered body of piezoelectric/electrostrictive porcelain composition used as a piezoelectric/electrostrictive body has advantages of high electro-mechanical conversion efficiency, large force generation, high response speed, high durability, and low power consumption, in addition to the advantage that it can precisely control its displacement, and it is adopted as an inkjet head, a micro-pump and the like by use of these advantages.

However, in the art, concern about degradation or insulation breakdown of piezoelectric membrane (piezoelectric body) under high temperature and high humidity has been conventionally existing and, in order to suppress such degradation or insulation breakdown of piezoelectric membrane, various measures have been taken.

For example, Patent Document 1 describes that moisture intrusion into piezoelectric membrane is prevented by disposing an electrode with low water vapor permeability on the piezoelectric membrane as well as disposing protective membrane consisting of inorganic material and covering the periphery of the electrode and piezoelectric membrane.

In addition, Patent Document 2 describes that the thickness of an insulation layer made only by electrodepositing and baking (electrodeposition coating) acrylic lacquer or the like on the outer surface of a laminated piezoelectric actuator is insufficient, and therefore moisture intrusion from corner part is suppressed by performing second electrodeposition coating after electrodeposition coating of the lacquer.

Further, Patent Document 3 describes that a piezoelectric element for an inkjet head having microcracks occurred during slicing process is coated with epoxide-based adhesive to fill the microcracks and thereafter the epoxide-based adhesive is dried and hardened in order to improve its strength and make it moistureproof.

Furthermore, Patent Document 4 describes that migration of electrode material and short circuit is prevented by coating an internal electrode layer and the exposed area of an external electrode with silicone and harden the silicone to make it an exterior component.

CITATION LIST

Patent Literature

[Patent Document 1] Japanese Patent Application Laid-Open (kokai) No. 2009-081347
[Patent Document 2] Japanese Patent Application Laid-Open (kokai) No. 2003-347621
[Patent Document 3] Japanese Patent Application Laid-Open (kokai) No. 2003-062999
[Patent Document 4] Japanese Patent Application Laid-Open (kokai) No. 2000-270568

As mentioned above, in the art, concern about degradation or insulation breakdown of piezoelectric membrane, short circuit of electrodes and the like under high temperature and high humidity environment has been conventionally existing, and although keen examinations therefor have been stepped up and reliability for actual use has attained to high level, such concern has not yet been completely cast aside and is recognized as a subject still to be solved in an accelerated deterioration test and the like for quality control. Especially for problems such as degradation and insulation breakdown of a piezoelectric/electrostrictive layer, and short circuit of electrodes largely due to microcracks (minute cracks) occurring mainly between an active part (moving part) and an inert part (non-moving part) on polarization treatment or being driven as a piezoelectric/electrostrictive element, current condition is that prior art has not yet found out a sufficient solution therefor. The active part (moving part) and inert part (non-moving part) will be mentioned later in detail.

Namely, since the inorganic coating used as protective membrane for moisture prevention in said Patent Document 1 is rigid and inhibits displacement of a piezoelectric element, a countermeasure such as patterning is needed not to coat the active part. Actually, also in said Patent Document 1, it is a constituent feature that protective membrane should have an opening at a position corresponding to portion except periphery of piezoelectric membrane (i.e., an active part). Such patterning complicates a manufacturing process and leads to increase in cost.

On the other hand, although said Patent Documents 2 to 4 disclose that organic coating is used as moistureproof membrane, its moistureproof property and consequently high humidity insulation property are insufficient as compared with inorganic coating and, in addition, the fact remains that even organic coating inhibits displacement of a piezoelectric element to some extent in its hardened state after curing.

SUMMARY OF THE INVENTION

The present invention, conceived to solve such problems, has an objective to improve insulation durability of a piezoelectric/electrostrictive actuator under high humidity atmosphere while suppressing inhibition of piezoelectric displacement.

Means for Solving the Problem

The first embodiment of the present invention for solving the above problems is;

a piezoelectric/electrostrictive actuator, which comprises:

a piezoelectric/electrostrictive element that comprises at least one laminate including one piezoelectric/electrostrictive layer and one pair of electrodes disposed respectively on both sides of said piezoelectric/electrostrictive layer and has a moving part corresponding to a portion where said piezoelectric/electrostrictive layer is sandwiched by one pair of said electrodes and a non-moving part corresponding to a portion where said piezoelectric/electrostrictive layer is not sandwiched by one pair of said electrodes, and a moistureproof membrane disposed to cover at least the proximity of the boundary between said moving part and said non-moving part and consisting of silicone-based organic insulation material with storage elastic modulus of 100 kPa or less obtained by dynamic viscoelastic measurement using a parallel cone with diameter of 25 mm under a condition with strain of 0.1%, frequency of 1 Hz, gap of 0.5 mm and temperature of 22° C.

Also, the second embodiment of the present invention is;

the piezoelectric/electrostrictive actuator according to the first embodiment, wherein said piezoelectric/electrostrictive element is disposed on a substrate.

Further, the third embodiment of the present invention is;

the piezoelectric/electrostrictive actuator according to the second embodiment, wherein said substrate has a thin-walled part and said piezoelectric/electrostrictive element is disposed to cover at least a portion of the thin-walled part.

Furthermore, the fourth embodiment of the present invention is;

the piezoelectric/electrostrictive actuator according to the third embodiment, wherein said piezoelectric/electrostrictive element is fixed on a region corresponding to said thin-walled part on said substrate.

In addition, the fifth embodiment of the present invention is;

the piezoelectric/electrostrictive actuator according to one of the first to fourth embodiments, wherein minute cracks exist in the proximity of the boundary between said moving part and said non-moving part in said piezoelectric/electrostrictive element, and the cracks are filled with said silicone-based organic insulation material constituting said moistureproof membrane.

Also, the sixth embodiment of the present invention is;

the piezoelectric/electrostrictive actuator according to one of the first to fifth embodiments, wherein at least one protective membrane is further disposed on said moistureproof membrane.

Further, the seventh embodiment of the present invention is;

the piezoelectric/electrostrictive actuator according to the sixth embodiment, wherein at least one of said protective membrane comprises fluorochemical organic material.

Furthermore, the eighth embodiment of the present invention is;

the piezoelectric/electrostrictive actuator according to the sixth embodiment, wherein at least one of said protective membrane is formed by hardening the surface of said moistureproof membrane.

In addition, the ninth embodiment of the present invention is;

the piezoelectric/electrostrictive actuator according to one of the second to eighth embodiments, wherein said substrate and said piezoelectric/electrostrictive element are fixed via said electrode.

Effect of the Invention

In accordance with the present invention, a piezoelectric/electrostrictive actuator presenting excellent insulation durability even under high humidity atmosphere while suppressing inhibition of piezoelectric displacement is provided.

DETAILED DESCRIPTION OF THE INVENTION

The present invention has been conceived based on the fact that it was found out that, surprisingly, high humidity insulation degradation can be more effectively prevented by using moistureproof membrane consisting of silicone-based organic insulation material having low elastic modulus when high humidity insulation degradation (for example, degradation or insulation breakdown of a piezoelectric/electrostrictive layer, short circuit of electrodes and the like) largely due to microcracks occurring mainly in the proximity of the boundary between a moving part and a non-moving part of a portion consisting of a substrate and a piezoelectric/electrostrictive element on polarization treatment or being driven as a piezoelectric/electrostrictive element is to be suppressed by disposing moistureproof membrane to cover at least the proximity of the boundary between the moving part and the non-moving part, in a piezoelectric/electrostrictive actuator comprising the piezoelectric/electrostrictive element. Herein, said "moving part" refers to a portion corresponding to a portion where a piezoelectric/electrostrictive layer is sandwiched by one pair of electrodes in a piezoelectric/electrostrictive element (i.e., a portion which generates displacement on application of electric field), and said "non-moving part" refers to a portion corresponding to a portion where a piezoelectric/electrostrictive layer is not sandwiched by one pair of electrodes in a piezoelectric/electrostrictive element (i.e., a portion which hardly or never generates displacement on application of electric field).

First Embodiment

A piezoelectric/electrostrictive actuator according to the first embodiment of the present invention is;

a piezoelectric/electrostrictive actuator, which comprises:

a piezoelectric/electrostrictive element that comprises at least one laminate including one piezoelectric/electrostrictive layer and one pair of electrodes disposed respectively on both sides of said piezoelectric/electrostrictive layer and has a moving part corresponding to a portion where said piezoelectric/electrostrictive layer is sandwiched by one pair of said electrodes and a non-moving part corresponding to a portion where said piezoelectric/electrostrictive layer is not sandwiched by one pair of said electrodes, and a moistureproof membrane disposed to cover at least the proximity of the boundary between said moving part and said non-moving part and consisting of silicone-based organic insulation material with storage elastic modulus of 100 kPa or less obtained by dynamic viscoelastic measurement using a parallel cone with diameter of 25 mm under a condition with strain of 0.1%, frequency of 1 Hz, gap of 0.5 mm and temperature of 22° C.

The piezoelectric/electrostrictive layer can be properly selected from various piezoelectric/electrostrictive porcelain compositions used for manufacturing piezoelectric/electrostrictive sintered bodies, including lead zirconate titanate (PZT)-based piezoelectric/electrostrictive porcelain compositions and non-lead-based piezoelectric/electrostrictive porcelain compositions, the development of which has been energetically advanced from a viewpoint of environmental protection in recent years. The electrode can be properly selected from various materials used as an electrode in the art, for example, gold (Au), silver (Ag), platinum (Pt) and the like.

Lamination of a piezoelectric/electrostrictive layer (may be referred as a "piezoelectric body") and these electrodes may be performed in any method well-known in the art (for example, vapor-phase epitaxial method, or firing after screen printing each layer).

Further, the thickness of the piezoelectric/electrostrictive layer and electrodes can be properly configured in accordance with the usage to which a piezoelectric/electrostrictive actuator according to the present invention is applied. Similarly, the thickness of the substrate and the thickness and area of the thin-walled part, the volume of the opening of the thick-walled part (the thickness of a thick-walled part) can be properly configured in accordance with the usage to which a piezoelectric/electrostrictive actuator according to the present invention is applied.

By the way, the piezoelectric/electrostrictive element may comprise two or more of the laminates. Such a piezoelectric/electrostrictive element comprising two or more of the laminates can be manufactured in a method well-known in the art, too.

In any case, since it is apparent for a person skilled in the art that the piezoelectric/electrostrictive element can be manufactured in various configurations by using various methods known in the art, further explanation in detail is omitted herein.

Regardless of the number of the laminates (including one piezoelectric/electrostrictive layer and one pair of electrodes disposed respectively on both sides of said piezoelectric/electrostrictive layer) which the piezoelectric/electrostrictive element comprises, the piezoelectric/electrostrictive element included in the piezoelectric/electrostrictive actuator according to the present invention has a moving part corresponding to a portion where the piezoelectric/electrostrictive layer is sandwiched by one pair of the electrodes and a non-moving part corresponding to a portion where the piezoelectric/electrostrictive layer is not sandwiched by one pair of the electrodes.

In the piezoelectric/electrostrictive element, the moving part refers to a portion corresponding to a portion where the piezoelectric/electrostrictive layer is sandwiched by one pair of the electrodes, and the moving part generates deformation (displacement) in accordance with applied electric field when the electric field is applied between the electrodes in the piezoelectric/electrostrictive element after firing. On the other hand, the non-moving part refers to a portion corresponding to a portion where the piezoelectric/electrostrictive layer is not sandwiched by one pair of the electrodes, and the non-moving part hardly or never generates deformation (displacement) in accordance with applied electric field even when the electric field is applied between the electrodes in the piezoelectric/electrostrictive element after firing.

Accordingly, on polarization treatment or being driven as a piezoelectric/electrostrictive element, stress tends to act on the proximity of the boundary between the moving part and the non-moving part to generate microcracks. The microcracks mainly causes problems such as degradation and insulation breakdown of the piezoelectric/electrostrictive layer, and short circuit of the electrodes and decreases insulation durability of the piezoelectric/electrostrictive element under high humidity atmosphere.

Therefore, approaches to dispose moistureproof membrane in the proximity of the boundary between a moving part and a non-moving part have been conventionally investigated, however, in the present invention, surprisingly, high humidity insulation degradation is more effectively prevented by using moistureproof membrane consisting of silicone-based organic insulation material having low elastic modulus. Herein, the "silicone-based organic insulation material having low elastic modulus" specifically refers to silicone-based organic insulation material with storage elastic modulus of 100 kPa or less obtained by dynamic viscoelastic measurement using a parallel cone With diameter of 25 mm under a condition with strain of 0.1%, frequency of 0.1 Hz, gap of 0.5 mm and temperature of 22° C.

Namely, material for moistureproof membrane in the piezoelectric/electrostrictive actuator according to the present invention can be properly selected from various available silicone-based organic insulation materials and used, as long as its storage elastic modulus measured by dynamic viscoelastic measurement under the above-mentioned condition is 100 kPa or less. When the storage elastic modulus exceeds 100 kPa, it becomes difficult to suppress the decrease in insulation property of the piezoelectric/electrostrictive element under high humidity atmosphere.

It is considered that the above is because that it becomes difficult for the material of the moistureproof membrane to go into microcracks occurring in the proximity of the boundary between a moving part and a non-moving part on polarization treatment or being driven as a piezoelectric/electrostrictive element or it becomes difficult for the moistureproof membrane to follow movement of a piezoelectric/electrostrictive element on being driven as a piezoelectric/electrostrictive element to cause detachment when the storage elastic modulus exceeds 100 kPa. More preferably, storage elastic modulus of silicone-based organic insulation material as material for moistureproof membrane in the piezoelectric/electrostrictive actuator according to the present invention measured by dynamic viscoelastic measurement under the above-mentioned condition is desirably 80 kPa or less.

Accordingly, among various materials including various organic materials and inorganic materials, materials with storage elastic modulus exceeding the above upper limit (for example, organic macromolecular materials in the form of rubber or resin (e.g., polyolefin resin, polyparaxylylene resin, fluororesin and the like) and inorganic materials (e.g., $SiO_2$ membrane and the like)) are inadequate for this usage and, even silicone-based organic insulation material, materials with storage elastic modulus exceeding the above upper limit (for example, silicone rubber) are not adequate for this usage.

The storage elastic modulus can be measured in a common method known as so-called "dynamic viscoelastic measurement". As an example of measuring apparatuses for dynamic viscoelasticity, Rheometer MCR 301 made by Anton Paar can be exemplified. Also, as an example of measuring conditions, dynamic viscoelastic measurement using a parallel cone with diameter of 25 mm under a condition with strain of 0.1%, frequency of 1 Hz, gap of 0.5 mm and temperature of 22° C. can be exemplified, as mentioned previously.

On the other hand, as long as the requirement with respect to elastic modulus is fulfilled, the silicone-based organic insulation material may be any silicone-based organic insulation material. Specifically, as the silicone-based organic insulation material, liquid or gelled silicone-based organic insulation materials can be used, and more specifically silicone-based oils and silicone-based gel are desirable.

Although various solvents and various oils, various polymers and resins and the like are supposed as liquid or gel fulfilling the requirement with respect to elastic modulus, as a result of the inventor's investigation (will be described later in detail), so-called "silicone-based" organic insulation materials containing silicon (Si) in their molecules are desirable, and it has been revealed that the decrease in insulation property of a piezoelectric/electrostrictive element under high humidity atmosphere cannot be suppressed when organic insulation material not containing Si, such as fluorochemical organic material (for example, fluorochemical oil) or hydrocarbon series material (for example, organic solvent), is used, even though the requirement with respect to elastic modulus is fulfilled.

The moistureproof membrane consisting of silicone-based organic insulation material with storage elastic modulus of 100 kPa or less obtained by dynamic viscoelastic measurement under the previously mentioned condition is needed to be disposed so as to cover at least the proximity of the boundary between the moving part and the non-moving part. As mentioned previously, this is in order to prevent moisture intrusion into the piezoelectric/electrostrictive element by covering the proximity of the boundary between the moving part and the non-moving part where microcracks mainly occur, which may cause high humidity insulation degradation (decrease in insulation property of a piezoelectric/electrostrictive element under high humidity atmosphere).

Accordingly, the moistureproof membrane may cover a portion other than the proximity of the boundary between the moving part and the non-moving part of the outer surface on the side where the piezoelectric/electrostrictive element is fixed, in the absence of any other disadvantage (in manufacturing process and the like), as long as it covers at least the proximity of the boundary between the moving part and the non-moving part.

It is desirable that the moistureproof membrane is coated after the polarization treatment of the piezoelectric/electrostrictive actuator with the piezoelectric/electrostrictive element fixed on the substrate. Methods for coating the moistureproof membrane can be properly selected from various well-known coating methods in accordance with properties (such as viscosity) of silicone-based organic insulation material constituting the moistureproof membrane, configuration of the piezoelectric/electrostrictive actuator with the piezoelectric/electrostrictive element fixed on the substrate and the like. Specifically, as methods for coating the moistureproof membrane, spin coating, spray coating, coating by dispenser or inkjet, screen printing, stamp printing and the like can be exemplified.

It is desirable that the thickness of the moistureproof membrane is in the range from 0.01 to 10 μm. The thickness of moistureproof membrane thinner than the range is not desirable, since coating unevenness may occur to make it difficult to coat moistureproof membrane as an even and continuous membrane and impair moistureproof effect. Conversely, the thickness of the moistureproof membrane thicker than the range is not desirable, since problems that material for moistureproof membrane overruns outside intended region (overspill) and the like may occur. More preferably, it is desirable that the thickness of the moistureproof membrane is in the range from 0.02 to 8 μm.

Second Embodiment

Next, a piezoelectric/electrostrictive actuator according to the second embodiment of the present invention is;
the piezoelectric/electrostrictive actuator according to said first embodiment, wherein said piezoelectric/electrostrictive element is disposed on a substrate.

The substrate is one of substrates generally used as substrates for piezoelectric/electrostrictive actuators and, for example, it may be manufactured with material(s) such as zirconium oxide ($ZrO_2$), silicon dioxide ($SiO_2$) and aluminum oxide ($Al_2O_3$). Also, the substrate may contain small amount(s) of additive(s) such as yttrium oxide ($Y_2O_3$), titanium oxide ($TiO_2$). As a method for manufacturing the substrate, any methods well-known in the art (for example, green sheet forming and the like) can be used.

Third Embodiment

A piezoelectric/electrostrictive actuator according to the third embodiment of the present invention is;
the piezoelectric/electrostrictive actuator according to said second embodiment, wherein said substrate has a thin-walled part and said piezoelectric/electrostrictive element is disposed to cover at least a portion of the thin-walled part.

As described above, in the present embodiment, said substrate has a thin-walled part, and said piezoelectric/electrostrictive element is disposed to cover at least a portion of the thin-walled part. This thin-walled part can be also formed in any method generally used for manufacturing substrates for piezoelectric/electrostrictive actuators. For example, the thin-walled part may be formed by cutting the substrate in a method such as etching, or may be formed by laminating a relatively thin member intended to form a thin-walled part (for example, with thickness of several micro meters) with another relatively thick member (thick-walled part) which has been fabricated so as to have an opening at a place corresponding to a thin-walled part.

Namely, whether it is integrated or laminated, it comes to that a space, which has a certain face (for example, top face) contacts with the thin-walled part and face(s) intersecting with the certain face (for example, lateral face(s)) contact with the inner wall of the opening of the thick-walled part, exists on a side opposite to the side, on which a piezoelectric/electrostrictive element is disposed, of the thin-wall part.

When a piezoelectric/electrostrictive actuator is used as a liquid injection head such as an inkjet head used in an inkjet printer, in general, a mechanism for injecting liquid such as ink (for example, injection nozzle and the like) is disposed to be connected with the aperture plane (plane contacting with neither the thin-walled part nor the inner wall of the thick-walled part) of the space. To the configuration of such a injection mechanism, any configurations generally used in the art of liquid injection heads.

Fourth Embodiment

A piezoelectric/electrostrictive actuator according to the fourth embodiment of the present invention is;
the piezoelectric/electrostrictive actuator according to said third embodiment, wherein said piezoelectric/electrostrictive element is fixed on a region corresponding to said thin-walled part on said substrate.

In other words, in the present embodiment, said piezoelectric/electrostrictive element is fixed on a region corresponding to the thin-walled part, on the side opposite to said space (opening of the thick-walled part) on said substrate. The piezoelectric/electrostrictive element comprises at least one laminate including one piezoelectric/electrostrictive layer and one pair of electrodes disposed respectively on both sides of said piezoelectric/electrostrictive layer.

Fifth Embodiment

A piezoelectric/electrostrictive actuator according to the fifth embodiment of the present invention is;
the piezoelectric/electrostrictive actuator according to one of said first to fourth embodiments, wherein minute cracks exist in the proximity of the boundary between said moving part and said non-moving part in said piezoelectric/electrostrictive element, and the cracks are filled with said silicone-based organic insulation material constituting said moistureproof membrane.

As mentioned previously, microcracks (minute cracks) causing high humidity insulation degradation tend to occur in the proximity of the boundary between a moving part and a non-moving part when a piezoelectric/electrostrictive element having the moving part and non-moving part is subjected to polarization treatment or driven as a piezoelectric/electrostrictive element. Accordingly, as mentioned previously, by coating the moistureproof membrane after polarization treatment of the piezoelectric/electrostrictive element to fill microcracks, which occurred during the polarization treatment, with silicone-based organic insulation material constituting the moistureproof membrane, moisture intrusion via the crack can be effectively suppressed.

In many cases, the microcracks are spontaneously filled with silicone-based organic insulation material by virtue of so-called "capillary phenomenon" when the silicone-based organic insulation material is coated. However, depending on the properties (such as viscosity) of silicone-based organic insulation material and the size and shape of the microcracks and the like, the microcracks may not be spontaneously filled with the silicone-based organic insulation material. In this case, filling of silicone-based organic insulation material into microcracks may be accelerated, for example, by vacuuming or the like.

The microcracks may occur not only on polarization treatment of the piezoelectric/electrostrictive element, but also on being driven as a piezoelectric/electrostrictive element. However, as mentioned above, the moistureproof membrane is coated after polarization treatment of the piezoelectric/electrostrictive element. Therefore, even if additional microcracks occur thereafter in the proximity of the boundary between the moving part and the non-moving part when being driven as a piezoelectric/electrostrictive element, since the additionally occurred microcracks have been covered with the silicone-based organic insulation material constituting the moistureproof membrane, the silicone-based organic insulation material immediately intrudes into the additionally occurred microcracks, and thereby high humidity insulation degradation due to the microcracks is suppressed.

Sixth Embodiment

A piezoelectric/electrostrictive actuator according to the sixth embodiment of the present invention is;
the piezoelectric/electrostrictive actuator according to one of said first to fifth embodiments, wherein at least one protective membrane is further disposed on said moistureproof membrane.

As a matter of course, it is desirable that the protective membrane comprises material which neither mixes nor reacts with the silicone-based organic insulation material constituting said moistureproof membrane. More preferably, it is desirable that the protective membrane is coated over said moistureproof membrane to be able to further improve moistureproof performance of the piezoelectric/electrostrictive actuator according to the present embodiments. As material constituting the protective membrane, for example, fluororesin, which can be dissolved in fluorochemical solvent and be dried to be film, and the like can be exemplified.

By the way, as mentioned previously, the moistureproof membrane consists of the silicone-based organic insulation material with storage elastic modulus of 100 kPa or less measured by dynamic viscoelastic measurement under the previously mentioned condition. Since moistureproof membrane consisting of material with such low elastic modulus is too soft by itself, for example,
handling problems that the moistureproof membrane may contact with another member to adhere to the member when the piezoelectric/electrostrictive actuator is assembled into an intended apparatus such as a liquid injection head (specifically, an inkjet head and the like), the moistureproof membrane may flow and overrun outside a predetermined place due to the inclination of the piezoelectric/electrostrictive actuator and the like, and long-term durability problems that, during long term usage of the piezoelectric/electrostrictive actuator, the silicone-based organic insulation material constituting the moistureproof membrane gradually evaporates to decrease the function as moistureproof membrane and the like are concerned.

Accordingly, in order to solve the problems as described above, piezoelectric/electrostrictive actuator according to the sixth embodiment of the present invention wherein at least one protective membrane is further disposed on the moistureproof membrane is suitable. Preferably, it is desirable that the protective membrane has Young's modulus of 1 MPa or more. By covering the moistureproof membrane with protective membrane with relatively high elastic modulus (harder) as compared with the moistureproof membrane, the handling problems and long term durability problems, as described above, concerned on the piezoelectric/electrostrictive actuator according to the present invention can be solved.

Young's modulus of the protective membrane can be measured, for example, in the method specified in JIS K 7127. The protective membrane with Young's modulus of less than 1 MPa is not desirable, since especially the previously mentioned handling problems are not sufficiently solved. More preferably, it desirable that Young's modulus of the protective membrane is 10 MPa or more.

Even when (harder) protective membrane with higher elastic modulus as compared with moistureproof membrane is coated as described above, unlike the case where (hard) moistureproof membrane with high elastic modulus is coated, a problem that piezoelectric displacement is inhibited does not occur. This is considered to be because that the protective membrane is coated on the moistureproof membrane and thereby the moistureproof membrane with low elastic modulus directly contacts with the moving part, and therefore piezoelectric displacement generated in the moving part is relieved/absorbed in the moistureproof membrane and is unlikely to suffer from the influence by the protective membrane (inhibition of piezoelectric displacement) in this condition.

Methods for coating the protective membrane can be properly selected from various well-known coating methods in accordance with properties (such as viscosity) of material constituting the protective membrane, configuration of the piezoelectric/electrostrictive actuator with the piezoelectric/electrostrictive element fixed on the substrate and the like. Specifically, as methods for coating the protective membrane, spin coating, spray coating, coating by dispenser or inkjet, screen printing and the like can be exemplified.

It is desirable that the thickness of the protective membrane is in the range from 0.1 to 10 µm. The thickness of moistureproof membrane thinner than the range is not desirable, since it becomes difficult to coat protective membrane as an even and continuous membrane and problems such as occurrence of hole(s) in protective membrane occur. Conversely, the thickness of protective membrane thicker than the range is not desirable, since problems that material for protective membrane overruns outside intended region (overspill) and the like occur. More preferably, it is desirable that the thickness of the protective membrane is in the range from 0.2 to 8 µm.

Seventh Embodiment

A piezoelectric/electrostrictive actuator according to the seventh embodiment of the present invention is;
the piezoelectric/electrostrictive actuator according to said sixth embodiment, wherein at least one of said protective membrane comprises fluorochemical organic material.

As mentioned previously, it is desirable that the protective membrane comprises material which neither mixes nor reacts with the silicone-based organic insulation material constituting said moistureproof membrane and, more preferably, which can further improve moistureproof performance of the piezoelectric/electrostrictive actuator according to the present embodiments when it is coated on said moistureproof membrane. As such material, fluororesin is especially preferred.

Eighth Embodiment

A piezoelectric/electrostrictive actuator according to the eighth embodiment of the present invention is;
the piezoelectric/electrostrictive actuator according to said sixth embodiment, wherein at least one of said protective membrane is formed by hardening the surface of said moistureproof membrane.

In the piezoelectric/electrostrictive actuator according to the previously mentioned seventh embodiment, at least one of the protective membrane comprising fluorochemical organic material is further disposed on the moistureproof membrane. Although the protective membrane may be disposed by thus coating it as a layer separate from the moistureproof membrane on the moistureproof membrane, the protective membrane may be formed by hardening the surface of the moistureproof membrane. As methods for hardening the surface of the moistureproof membrane, for example, plasma exposure treatment, ultraviolet curing treatment, moisture curing treatment and the like can be exemplified. In addition, the protective membrane may be formed by mixing or dissolving the protective membrane component (for example, fluororesin) into the solution of the moistureproof membrane (for example, silicone oil), extricating the protective membrane component on the surface of the moistureproof membrane by virtue of heating treatment or the like, and thereafter subjecting the surface to plasma exposure treatment, ultraviolet curing treatment, moisture curing treatment or the like to harden the extricated protective membrane component.

Ninth Embodiment

A piezoelectric/electrostrictive actuator according to the ninth embodiment of the present invention is;
the piezoelectric/electrostrictive actuator according to one of said second to eighth embodiments, wherein said substrate and said piezoelectric/electrostrictive element are fixed via said electrode.

In addition, in embodiments depending on the above mentioned sixth to eighth embodiments and in embodiments depending on the above mentioned sixth to eighth embodiments among embodiments included in the ninth embodiment (i.e., in embodiments provided with protective membrane), the protective membrane may have two-layer structure. Specifically, after coating protective membrane according to the above mentioned embodiments as a first protective membrane, membrane with higher moistureproof effect may be laminated as a second protective membrane by using a vacuum equipment or the like. More specifically, for example, by virtue of sputtering technique, chemical vapor deposition (CVD) or the like, alumina, glass, polyparaxylylene or the like may be laminated on the first layer to dispose the second layer. When such a second layer is disposed, more preferably, outgas from the moistureproof membrane and the first protective membrane can be suppressed.

Although the examples described below will more particularly describe the present invention, the technical scope of the present invention is not limited to these examples.

EXAMPLE

Method for Manufacturing Piezoelectric/electrostrictive Actuator

Method for manufacturing piezoelectric/electrostrictive actuators according to Practical Examples 1 to 5 of the present invention and Comparative Examples 1 to 9 will be described below. However, manufacturing methods and the like which will be described below are absolutely exemplifications, and methods for manufacturing piezoelectric/electrostrictive actuators according to the present invention are not limited thereto.

(1) Manufacturing of Piezoelectric/Electrostrictive Actuator

Figure 1:
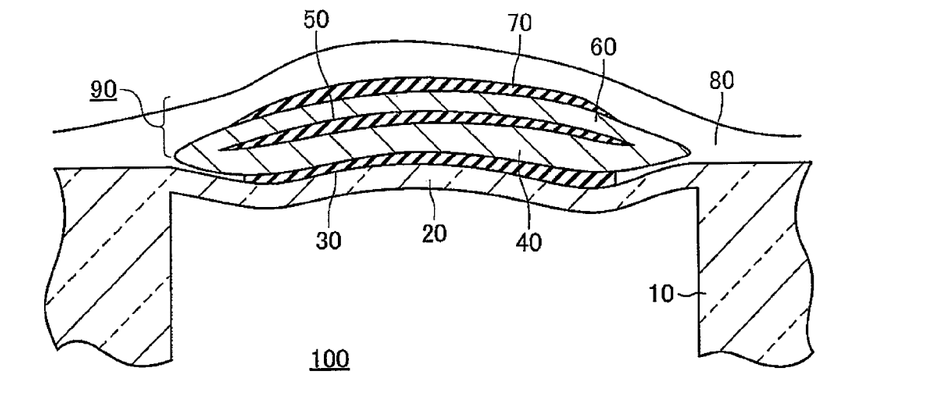
FIG. 1 is a cross-section view of a piezoelectric/electrostrictive actuator.

Herein, referring to FIG. 1, description will be provided. First, substrate 10 with thickness of 6 μm at a thin-walled part 20 was formed by green sheet forming and sintered at 1450° C. Next, on the region corresponding to the thin-walled part 20, a platinum (Pt) electrode (lower electrode 30) with thickness of 1.5 μm and width of 120 μm was laminated by screen printing, and sintered at 1350° C. On the lower electrode 30, a lower piezoelectric membrane 40 with thickness of 6 μm and width of 160 μm was laminated by screen printing, and a platinum (Pt) electrode (inner electrode 50) with thickness of 1.5 μm and width of 120 μm and a upper piezoelectric membrane 60 with thickness of 6 μm and width of 160 μm were laminated by screen printing, and sintered at 1250° C. Further, on the upper electrode 60, a gold (Au) electrode (upper electrode 70) with thickness of 0.2 μm and width of 120 μm was laminated by screen printing, and sintered at 800° C.

Namely, since a piezoelectric/electrostrictive actuator 100 used in the present examples has a configuration that, as described above, the inner electrode 50 is sandwiched by two layers of piezoelectric membrane (the lower piezoelectric membrane 40 and the upper piezoelectric membrane 60) and the lower electrode 30 and the upper electrode 70 are disposed on the both surfaces thereof, it comes to that a piezoelectric/electrostrictive element 90 in the present examples comprises two of the previously mentioned "laminate including one piezoelectric/electrostrictive layer and one pair of electrodes disposed respectively on both sides of said piezoelectric/electrostrictive layer". However, an embodiment wherein a piezoelectric/electrostrictive element comprises only one of the laminate and an embodiment wherein a piezoelectric/electrostrictive element comprises three or more of the laminates are also included in the scope of the present invention. The length of the piezoelectric/electrostrictive actuator 100 in its longitudinal direction (direction orthogonal to the width direction and the thickness direction) was 1000 μm.

As material for the substrate 10, zirconium oxide ($ZrO_2$) containing 3 mol %, corresponding to metal element, of yttrium oxide ($Y_2O_3$) was used. As material for the piezoelectric membrane 40 and 60, 0.20 Pb($Mg_{1/3}Nb_{2/3}$)$O_3$+0.17 Pb($Ni_{1/3}Nb_{2/3}$)$O_3$+0.80 PZT was used.

(2) Polarization Treatment of Piezoelectric/electrostrictive Actuator

The piezoelectric/electrostrictive actuator obtained as described above was subjected to polarization treatment. The piezoelectric/electrostrictive actuator with electrodes formed as described above (sintered body) was immersed in insulation oil (for example, silicone oil or the like), and voltage was applied to the electrodes of the piezoelectric/electrostrictive actuator. At this time, it is desirable that high-temperature polarization treatment wherein the piezoelectric/electrostrictive actuator is heated up to 50 to 150° C. is performed. In the high-temperature polarization treatment, electric field of 2 to 10 kV/mm is applied. Although, In the present examples, the piezoelectric/electrostrictive actuator 100 was immersed in silicone oil and electric field of 10 kV/mm was applied, condition for polarization treatment can be properly selected from various well-known techniques in accordance with the configuration of the piezoelectric/electrostrictive element 90 and the like.

When aging treatment is additionally performed, the piezoelectric/electrostrictive actuator with the electrodes opened may be heated up to 100 to 300° C. in the air.

(3) Coating of Moistureproof Membrane

On the outer surface on the side where the laminate (piezoelectric/electrostrictive element 90) of piezoelectric membrane and the electrodes was fixed of the piezoelectric/electrostrictive actuator 100 manufactured as described above, moistureproof membrane 80 was coated by spin coating method. Material, coating thickness and elastic modulus of each moistureproof membrane in the piezoelectric/electrostrictive actuators according to Practical Example 1 to 5 and Comparative Example 1 to 9 are listed in Table 1 below. Although, in the present examples, as described above, moistureproof membrane was coated by spin coating method, as mentioned previously, in accordance with properties of material constituting the moistureproof membrane, configuration of piezoelectric/electrostrictive actuator and the like, a suitable method can be properly selected from various coating methods well-known in the art and used.

(4) Coating of Protective Membrane

Only for the piezoelectric/electrostrictive actuator according to Practical Example 5 among various piezoelectric/electrostrictive actuators manufactured as described above and coated with moistureproof membrane, another protective membrane was further coated on the moistureproof membrane 80 by spin coating method. In Table 1 below, data (specifically, material, coating thickness and elastic modulus) with respect to the protective membrane in Practical Example 5 were described in parentheses. As a matter of course, methods for coating protective membrane are not limited to spin coating and, as mentioned previously, in accordance with properties of material constituting the protective membrane, configuration of piezoelectric/electrostrictive actuator and the like, a suitable method can be properly selected from various coating methods well-known in the art.

Evaluation of High Humidity Isolation Degradation

A method for evaluating the high humidity isolation degradation of the piezoelectric/electrostrictive actuators in the present examples will be described below.

(1) Accelerated Deterioration Test

The piezoelectric/electrostrictive actuators manufactured as described above were driven for 100 hours by applying direct current of 4 kV/mm under a condition of 40° C. and 85% RH. This accelerated deterioration test was performed on 900 samples for each of the piezoelectric/electrostrictive actuators according to various practical examples and comparative examples listed in Table 1.

(2) Insulation Resistance Measurement

For each of the piezoelectric/electrostrictive actuators according to various practical examples and comparative examples, samples that damage or deformation was observed in appearance were eliminated from the 900 samples subjected to the accelerated deterioration test and, for the rest of the samples, insulation resistance was measured. The lowest value among the obtained insulation resistance values was defined as the insulation resistance value after degradation of each of the piezoelectric/electrostrictive actuators. Namely, it comes to that the higher the insulation resistance value after degradation is, the higher the insulation durability of the piezoelectric/electrostrictive actuator under high humidity atmosphere is. For all piezoelectric/electrostrictive actuators, the insulation resistance (before degradation) before performing the accelerated deterioration test was 1000 MΩ or more.

(3) Piezoelectric Displacement Measurement

For each of the piezoelectric/electrostrictive actuators according to various practical examples and comparative examples, after the accelerated deterioration test, in electric field of 4 kV/mm, displacement magnitude in the thickness direction was measured by virtue of laser Doppler and defined as amount of piezoelectric displacement. When material coated as the moistureproof membrane is hard (high elastic modulus) and inhibits the displacement of piezoelectric/electrostrictive actuator, the amount of piezoelectric displacement becomes smaller. Accordingly, larger amount of piezoelectric displacement is desirable, since it means that the inhibition of piezoelectric displacement by moistureproof membrane is smaller.

(4) Evaluation Result of High Humidity Isolation Degradation

The result of the insulation resistance measurement obtained by the above described procedure, as well as material and its elastic modulus used in each of various practical examples and comparative examples, is listed in the following Table 1.

TABLE 1

|  | Moistureproof Membrane Material | Thickness [μm] | Piezo. Displace. [μm] | Elastic Modulus [kPa] | Insulation Resist. [MΩ] |
| --- | --- | --- | --- | --- | --- |
| Com. 1 | None | — | 0.30 | — | 0.3 |
| Com. 2 | Terpineol | 1 | 0.30 | 0.00001 | 6 |
| Com. 3 | Polyolefin | 3 | 0.29 | 73000 | 0.3 |
| Com. 4 | Polyparaxylylene | 1 | 0.27 | 2500000 | 0.05 |
| Com. 5 | Fluorochemical Oil | 1 | 0.30 | 0.0006 | 10 |
| Com. 6 | Fluorochemical Gel | 3 | 0.30 | 1000 | 0.8 |
| Com. 7 | Fluorochemical Film | 3 | 0.29 | 87000 | 0.05 |
| Prac. 1 | Silicone-based Oil | 1 | 0.30 | 0.0006 | 500 |
| Prac. 2 | Silicone-based Oil | 1 | 0.30 | 0.0085 | 700 |
| Prac. 3 | Silicone-based Oil | 1 | 0.30 | 71 | 400 |
| Prac. 4 | Silicone-based Gel | 2 | 0.30 | 1 | 700 |

TABLE 1-continued

|   | Moistureproof Membrane Material | Thickness [μm] | Piezo. Displace. [μm] | Elastic Modulus [kPa] | Insulation Resist. [MΩ] |
|---|---|---|---|---|---|
| Com. 8 | Silicone-based Rubber | 3 | 0.28 | 2900 | 0.3 |
| Com. 9 | SiO$_2$ Film | 0.3 | 0.25 | 200000000 | 0.02 |
| Prac. 5 | Silicone-based Oil (Fluorochemical) | 1 (3) | 0.30 | 0.0006 (87000) | 1000 |

Note 1:
Data in parentheses in Practical Example 5 (Prac. 5) represent data for the protective membrane disposed on the moistureproof membrane. The amounts of piezoelectric displacement (Piezo. Displace.) and insulation resistance values after degradation (Insulation Resist.) were measured for whole actuator.

Note 2:
Elastic modulus of solvent, oil and gel was measured by dynamic viscoelastic measurement using a parallel cone with diameter of 25 mm under a condition with strain of 0.1%, frequency of 1 Hz, gap of 0.5 mm and temperature of 22° C. Elastic modulus of the rest (rubber and film) is Young's modulus by JIS K 7127.

As shown in Table 1, in the piezoelectric/electrostrictive actuator according to Comparative Example 1, as a control with no moistureproof membrane coated, as a matter of course, no inhibition of piezoelectric displacement was observed, while the insulation resistance after accelerated deterioration test remarkably decreased to 0.3 MΩ. It is considered that this is because that moisture intruded into the piezoelectric/electrostrictive actuator via microcracks occurred in the proximity of the boundary a moving part and a non-moving part due to the accelerated deterioration test.

Also, in the piezoelectric/electrostrictive actuators according to Comparative Examples 2 to 7 and adopting respectively organic solvent, polyolefin, polyparaxylylene, fluorochemical oil, fluorochemical gel and fluorochemical film as moistureproof membrane, the insulation resistance after accelerated deterioration test remarkably decreased to 10 MΩ or less. This implies that not only in the piezoelectric/electrostrictive actuators according to Comparative Examples 3, 4 and 7 and adopting respectively polyolefin, polyparaxylylene and fluorochemical film with high elastic modulus (hard) as moistureproof membrane, but also in the piezoelectric/electrostrictive actuators according to Comparative Examples 2, 5 and 6 and adopting respectively organic solvent, fluorochemical oil and fluorochemical gel with low elastic modulus as moistureproof membrane, material of the moistureproof membrane was not sufficiently filled into microcracks additionally occurred in the proximity of the boundary between the moving part and the non-moving part during the accelerated deterioration test, or a condition where the moistureproof membrane adhered tightly to the surface of the piezoelectric/electrostrictive actuators could not be maintained, and consequently high humidity insulation degradation could not be sufficiently suppressed.

Further, in the piezoelectric/electrostrictive actuators according to Comparative Examples 3, 4 and 7 and adopting respectively polyolefin, polyparaxylylene and fluorochemical film as moistureproof membrane, as compared with the piezoelectric/electrostrictive actuator according to Comparative Example 1 as a control with no moistureproof membrane coated, the amount of piezoelectric displacement decreased. This implies that high elastic modulus of the moistureproof membrane adopted in these piezoelectric/electrostrictive actuators caused the inhibition of piezoelectric displacement.

On the other hand, in the piezoelectric/electrostrictive actuators according to Practical Examples 1 to 4 and adopting respectively silicone-based oil and silicone-based gel with low elastic modulus as moistureproof membrane, with no inhibition of piezoelectric displacement, high insulation resistance comparable to that before accelerated deterioration test was maintained. This implies that microcracks additionally occurred in the proximity of the boundary between the moving part and the non-moving part during the accelerated deterioration test were also filled with material of the moistureproof membrane, and a condition where the moistureproof membrane adhered tightly to the surface of the piezoelectric/electrostrictive actuators could be maintained (detachment did not occur), and consequently high humidity insulation degradation could be sufficiently suppressed.

However, in the piezoelectric/electrostrictive actuators according to Comparative Example 8 and adopting silicone-based rubber, which has relatively high elastic modulus unlike the silicone-based oil and silicone-based gel while it is silicone-based material, as moistureproof membrane, as compared with the piezoelectric/electrostrictive actuator according to Comparative Example 1 as a control with no moistureproof membrane coated, the amount of piezoelectric displacement decreased and the insulation resistance after accelerated deterioration test remarkably decreased to 0.3 MΩ. This implies that the moistureproof membrane adopted in the piezoelectric/electrostrictive actuator according to Comparative Example 8 is silicone-based material, but its elastic modulus is high and therefore caused the inhibition of piezoelectric displacement, and that material of the moistureproof membrane was not sufficiently filled into microcracks additionally occurred in the proximity of the boundary between the moving part and the non-moving part during the accelerated deterioration test, or a condition where the moistureproof membrane adhered tightly to the surface of the piezoelectric/electrostrictive actuators could not be maintained, and consequently high humidity insulation degradation could not be sufficiently suppressed.

Also, in the piezoelectric/electrostrictive actuators according to Comparative Example 9 and adopting SiO$_2$ membrane with very high elastic modulus (very hard) as moistureproof membrane, as compared with the piezoelectric/electrostrictive actuator according to Comparative Example 1 as a control with no moistureproof membrane coated, the amount of piezoelectric displacement considerably decreased. This implies that the elastic modulus of the moistureproof membrane (SiO$_2$ membrane) adopted in the piezoelectric/electrostrictive actuator caused the remarkable inhibition of piezoelectric displacement. In addition, in the piezoelectric/electrostrictive actuators according to Comparative Example 9, the insulation resistance after accelerated deterioration test remarkably decreased to 0.02 MΩ. This implies that since SiO2 membrane with very high elastic modulus (very hard) was adopted as the moistureproof membrane, material of the moistureproof membrane was not sufficiently filled into microcracks additionally occurred in the proximity of the boundary between the moving part and the non-moving part during the accelerated deterioration test, and the moistureproof membrane could not maintain a condition where it was adhered tightly to the surface of the piezoelectric/electrostrictive actuators and detached therefrom, and consequently high humidity insulation degradation could not be sufficiently suppressed.

Further, the piezoelectric/electrostrictive actuator according to Practical Example 5 is the piezoelectric/electrostrictive actuator according to the fourth embodiment of the present invention, corresponding to the piezoelectric/electrostrictive actuator according to Practical Example 1 with protective membrane comprising fluororesin-based material further coated on its moistureproof membrane, with no inhibition of piezoelectric displacement, maintained high insulation resistance comparable to that before the accelerated deterioration test. This implies that, by further coating protective membrane comprising fluororesin-based material on the moistureproof membrane, the moistureproof performance of the piezoelectric/electrostrictive actuator was further improved, and high humidity insulation degradation could be sufficiently suppressed. In addition, as mentioned previously, even though protective membrane comprising fluororesin-based material with high elastic modulus (hard) was further coated on the moistureproof membrane, piezoelectric displacement was not inhibited. It is considered that this is because that membrane directly contacting with the moving part of the piezoelectric/electrostrictive actuator was the moistureproof membrane with low elastic modulus and the protective membrane with high elastic modulus did not directly contact with the moving part, and therefore piezoelectric displacement generated in the moving part is absorbed in the moistureproof membrane and is unlikely to suffer from the influence by the protective membrane in this condition.

INDUSTRIAL APPLICABILITY

As described above, in accordance with the present invention, a piezoelectric/electrostrictive actuator presenting excellent insulation durability even under high humidity atmosphere while suppressing inhibition of piezoelectric displacement is provided.

REFERENCE SIGNS LIST

10: substrate, 20: thin-walled part, 30: lower electrode, 40: lower piezoelectric membrane, 50: inner electrode, 60: upper piezoelectric membrane, 70: upper electrode, 80: moistureproof membrane, 90: piezoelectric/electrostrictive element and 100: piezoelectric/electrostrictive actuator.

The invention claimed is:

1. A piezoelectric/electrostrictive actuator, which comprises:
    a piezoelectric/electrostrictive element that comprises at least one laminate including one piezoelectric/electrostrictive layer and one pair of electrodes disposed respectively on both sides of said piezoelectric/electrostrictive layer and has a moving part corresponding to a portion where said piezoelectric/electrostrictive layer is sandwiched by one pair of said electrodes and a non-moving part corresponding to a portion where said piezoelectric/electrostrictive layer is not sandwiched by one pair of said electrodes, and
    a moistureproof membrane disposed to cover at least the proximity of the boundary between said moving part and said non-moving part and consisting of a silicone-based organic insulation material with a storage elastic modulus of 100 kPa or less obtained by dynamic viscoelastic measurement using a parallel cone with a diameter of 25 mm under a condition with a strain of 0.1%, a frequency of 1 Hz, a gap of 0.5 mm and a temperature of 22° C.

2. The piezoelectric/electrostrictive actuator according to claim 1, wherein said piezoelectric/electrostrictive element is disposed on a substrate.

3. The piezoelectric/electrostrictive actuator according to claim 2, wherein said substrate has a thin-walled part and said piezoelectric/electrostrictive element is disposed to cover at least a portion of the thin-walled part.

4. The piezoelectric/electrostrictive actuator according to claim 3, wherein said piezoelectric/electrostrictive element is fixed on said thin-walled part on said substrate.

5. The piezoelectric/electrostrictive actuator according to claim 1, wherein minute cracks exist in the proximity of the boundary between said moving part and said non-moving part in said piezoelectric/electrostrictive element, and the cracks are filled with said silicone-based organic insulation material constituting said moistureproof membrane.

6. The piezoelectric/electrostrictive actuator according to claim 1, wherein at least one protective membrane is further disposed on said moistureproof membrane.

7. The piezoelectric/electrostrictive actuator according to claim 6, wherein at least one of said protective membrane comprises fluorochemical organic material.

8. The piezoelectric/electrostrictive actuator according to claim 6, wherein at least one of said protective membrane is formed by hardening the surface of said moistureproof membrane.

9. The piezoelectric/electrostrictive actuator according to claim 2, wherein said substrate and said piezoelectric/electrostrictive element are fixed via said electrode.

10. The piezoelectric/electrostrictive actuator according to claim 1, wherein said silicone-based organic insulation material is silicone-based gel.

11. The piezoelectric/electrostrictive actuator according to claim 10, wherein said piezoelectric/electrostrictive element is disposed on a substrate.

12. The piezoelectric/electrostrictive actuator according to claim 9, wherein said substrate has a thin-walled part and said piezoelectric/electrostrictive element is disposed to cover at least a portion of the thin-walled part.

13. The piezoelectric/electrostrictive actuator according to claim 6, wherein the Young's modulus of said protective membrane is 1 MPa or more, and the thickness of said protective membrane is in the range from 0.1 to 10 μm.

14. The piezoelectric/electrostrictive actuator according to claim 6, wherein a second protective membrane is disposed on the side of said protective membrane opposite to said moistureproof membrane.

15. The piezoelectric/electrostrictive actuator according to claim 14, wherein said second protective membrane comprises at least one material selected from alumina, glass and polyparaxylylene.

16. The piezoelectric/electrostrictive actuator according to claim 14, wherein said second protective membrane is formed by sputtering or chemical vapor deposition.

17. The piezoelectric/electrostrictive actuator according to claim 15, wherein said second protective membrane is formed by sputtering or chemical vapor deposition.

* * * * *